US008622822B2

(12) United States Patent
Tanimura

(10) Patent No.: US 8,622,822 B2
(45) **Date of Patent: *Jan. 7, 2014**

(54) GAMING MACHINE, GAMING INFORMATION AUTHENTICATION AND ACQUISITION DEVICE, AND GAMING INFORMATION ACQUISITION DEVICE

(75) Inventor: Tatsuhiko Tanimura, Tokyo (JP)

(73) Assignee: Universal Entertainment Corporation, Tokyo (JP)

( * ) Notice: Subject to any disclaimer, the term of this patent is extended or adjusted under 35 U.S.C. 154(b) by 1309 days.

This patent is subject to a terminal disclaimer.

(21) Appl. No.: 11/404,893

(22) Filed: Apr. 17, 2006

(65) Prior Publication Data

US 2006/0247005 A1 Nov. 2, 2006

(30) Foreign Application Priority Data

Apr. 19, 2005 (JP) ................................ 2005-121389

(51) Int. Cl.
*A63F 13/00* (2006.01)
*H05K 1/00* (2006.01)

(52) U.S. Cl.
USPC .................................. 463/29; 463/24; 463/43

(58) Field of Classification Search
USPC ................................................ 463/24, 29, 43
See application file for complete search history.

(56) References Cited

U.S. PATENT DOCUMENTS

| | | | | |
|---|---|---|---|---|
| 4,799,635 | A * | 1/1989 | Nakagawa | 711/115 |
| 6,071,190 | A * | 6/2000 | Weiss et al. | 463/25 |
| 6,106,396 | A | 8/2000 | Alcorn et al. | |
| 6,446,238 | B1 * | 9/2002 | Canestaro et al. | 714/807 |
| 7,201,662 | B2 * | 4/2007 | LeMay et al. | 463/43 |
| 7,367,889 | B2 * | 5/2008 | Canterbury | 463/43 |

FOREIGN PATENT DOCUMENTS

| | | |
|---|---|---|
| EP | 1 352 677 | 10/2003 |
| JP | 08-241194 | 9/1996 |
| JP | 2001-344096 | 12/2001 |
| JP | 2002-341957 | 11/2002 |
| WO | WO 02/15998 | 2/2002 |

OTHER PUBLICATIONS

U.S. Appl. No. 11/404,892, filed Apr. 17, 2006, Tatsuhiko Tanimura.

* cited by examiner

*Primary Examiner* — Lawrence Galka
(74) *Attorney, Agent, or Firm* — KMF Patent Services, PLLC; S. Peter Konzel; Kenneth M. Fagin

(57) ABSTRACT

A gaming machine includes a gaming operation execution device, a loading device and a processing device. The gaming operation execution device executes gaming operations. The loading device includes a connector for connecting a storage medium which stores gaming information, a program memory for storing an authentication program, and a processor for authenticating the gaming information with the authentication program. The processing device is connected to the loading device and includes a readable and writable memory, a reading unit for reading out the gaming information authenticated by the processor, a writing unit for writing the gaming information to the readable and writable memory, and an operation control unit for controlling the gaming operation execution device.

3 Claims, 7 Drawing Sheets

GAMING MACHINE, GAMING INFORMATION AUTHENTICATION AND ACQUISITION DEVICE, AND GAMING INFORMATION ACQUISITION DEVICE

CROSS REFERENCE TO RELATED APPLICATIONS

This application is based upon and claims the benefit of priority from the prior Japanese Patent Application No. 2005-121389, filed on Apr. 19, 2005; the entire contents of which are incorporated herein by reference.

This application is related to the co-pending U.S. patent application entitled "GAMING MACHINE, GAMING INFORMATION AUTHENTICATION AND ACQUISITION DEVICE, AND GAMING INFORMATION ACQUISITION DEVICE" referred to as the Japanese Patent Application No. 2005-121397, filed in Japan on Apr. 19, 2005. The co-pending application including the specification, drawing and claims are expressly incorporated herein by reference in its entirety.

BACKGROUND OF THE INVENTION

1. Field of the Invention

The present invention relates to a gaming machine, a gaming information authenticating and loading device, and an loading device for loading gaming information, whereby gaming information recorded on a portable storage medium can be authenticated.

2. Related Background of the Invention

In the prior art, various types of gaming machines are known, such as gaming machines known as video game machines, slot machines, Pachislo machines, Pachinko machines, or the like, which provide image-based gaming by using images displayed on image display means. In recent years, in this type of gaming machine, it has become possible to supply a program (hereinafter, called a "gaming program") used to control the operations required for playing the game, such as controlling the progress of the game, controlling the display of images, and judging whether or not a prize has been won (a hit or miss judgment), and various types of game used for playing the game (hereinafter, collectively referred to as "gaming information"), by means of a storage medium. For example, gaming information is stored in a small, portable storage medium, such as a compact flash memory (registered trademark; also called "CF card"), and the gaming machine has a component which allows attachment and detachment of the storage medium, gaming information being supplied to the gaming machine by means of this storage medium.

Nevertheless, since the storage medium which stores the gaming information is detachable with respect to the gaming machine, then there is a risk that the medium could be removed from the gaming machine and used to perform illegal actions, such as duplicating or manipulating the gaming information stored on the medium. Therefore, in cases where gaming information is supplied by means of a storage medium, it is necessary to prevent illegal actions relating to the storage medium which stores the gaming information.

With regard to this point, for example, Japanese Patent Application Publication No. 2001-344096 discloses a method in which, when a storage medium is attached to a game device, storing identification information that is unique to the game device is stored on the storage medium from the game device, and identification information that is unique to the gaming information is also stored on the game device from the storage medium. Then, according to the method, the software stored on the storage medium is executed if the two sets of the identification information are the same in the game device and the storage medium.

Moreover, Japanese Patent Application Publication No. 2002-341957 discloses technology relating to the startup of a computer when a removable unit is attached to a computer main body, whereby the content of a user code stored in the removable unit is compared with the content of a unit code stored in the computer main body, and permission to start up the system is decided according to whether or not the respective contents are matching.

Furthermore, Japanese Patent Application Publication No. Hei. 8-241194 discloses a video game system in which a security check is performed repeatedly during the progress of a game, in order to compare a security code set in an information processing device, with an accumulation device (storage medium) which stores a game program and a security code.

SUMMARY OF THE INVENTION

However, in the conventional examples described in the aforementioned publications, there is a problem in that only the storage medium itself is authenticated, whereas authentication of the actual gaming information is not performed, in other words, it is not checked and verified that the gaming information stored on the storage medium has not been manipulated in some way.

In other words, the technology described in Japanese Patent Application Publication No. 2001-344096 simply makes it possible to prevent illegal actions of duplicating the gaming information stored on the storage medium, but it does not make it possible to prevent manipulation of the actual gaming information. Furthermore, in the technology described in Japanese Patent Application Publication No. 2002-341957, although authentication is carried out in respect of the removable unit itself, the data stored in the unit is not authenticated, and therefore, this technology does not make it possible to prevent manipulation of the data stored in the unit. Moreover, in the video game system described in Japanese Patent Application Publication No. Hei. 8-241194, although transfer to and execution of illegal software after the security check is prevented, it is not possible to prevent manipulation of the data stored on the recording medium.

Therefore, the present invention is devised in order to resolve the aforementioned problems, an object thereof being to provide a gaming machine, a gaming information authenticating and loading device, and an loading device for loading gaming information, whereby the gaming information stored on a storage medium can be authenticated.

According to the present invention, a gaming machine comprises a gaming operation execution device executing gaming operations for playing a game; a loading device including a connector for connecting a storage medium which stores gaming information to be used in playing the game, a program memory for storing an authentication program for authenticating the gaming information stored on the storage medium connected to the connector, and a processor for authenticating the gaming information with the authentication program stored in the program memory; and a processing device connected to the loading device, including a readable and writable memory, a reading unit for reading out the gaming information authenticated by the processor, a writing unit for writing the gaming information read out by the reading unit to the readable and writable memory, and an operation control unit for controlling the gaming operation execution device in accordance with the gaming information written to the readable and writable memory by the writing unit.

In this gaming machine, since the loading device is connected to the processing device, by connecting a storage medium storing gaming information to the connector of the loading device, it is possible to load the gaming information stored on the storage medium and to store the information in the readable and writable memory of the processing device. Furthermore, since an authentication program for authenticating the gaming information is stored in the program memory of the loading device, the loading process is carried out after the processor has performed authentication processing with the authentication program.

Moreover, the processor of the loading device may send an authentication completion signal to the reading unit of the processing device when completing authentication of the gaming information, and the reading unit may suspend readout of the gaming information until receiving the authentication completion signal from the processor. In this case, it is possible reliably to prevent situations where the reading unit reads out the gaming information before the authentication process of the gaming information by the processor has been completed.

Furthermore, the reading unit may perform readout of the gaming information after detecting completion of authentication of the gaming information by the processor. In this case, it is possible reliably to prevent situations where the reading unit reads out the gaming information before the authentication process of the gaming information by the processor has been completed.

According to the invention, the gaming information authenticating and loading device comprises a loading device including a connector for connecting a storage medium which stores gaming information to be used in playing a game, a program memory for storing an authentication program for authenticating the gaming information stored on the storage medium connected to the connector, and a processor for authenticating the gaming information with the authentication program stored in the program memory; and a processing device connected to the loading device, including a readable and writable memory, a reading unit for reading out the gaming information authenticated by the processor, a writing unit for writing the gaming information read out by the reading unit to the readable and writable memory.

In this gaming information authenticating and loading device, since the loading device is connected to the processing device, by connecting a storage medium storing gaming information to the connector of the loading device, it is possible to load the gaming information stored on the storage medium and to store the information in the readable and writable memory of the processing device. Furthermore, since an authentication program for authenticating the gaming information is stored in the program memory of the loading device, the loading process is carried out after the processor has performed authentication processing with the authentication program.

Moreover, the processor of the loading device may send an authentication completion signal to the reading unit of the processing device when completing authentication of the gaming information, and the reading unit may suspend readout of the gaming information until receiving the authentication completion signal from the processor. In this case, it is possible reliably to prevent situations where the reading unit reads out the gaming information before the authentication process of the gaming information by the processor has been completed.

Furthermore, the reading unit may perform readout of the gaming information after detecting completion of authentication of the gaming information by the processor. In this case, it is possible reliably to prevent situations where the reading unit reads out the gaming information before the authentication process of the gaming information by the processor has been completed.

According to the invention, the gaming information loading device is for loading stored gaming information to be used in playing a game from a storage medium and for sending the gaming information into a connected motherboard. The gaming information loading device comprises a connector for connecting a storage medium which stores the gaming information to be used in playing the game; a program memory for storing an authentication program for authenticating the gaming information stored on the storage medium connected to the connector; and a processor for authenticating the gaming information with the authentication program stored in the program memory.

When the gaming information loading device is connected to the motherboard, it is possible to carry out authentication processing for the gaming information with the authentication program before the gaming information stored in a storage medium connected to the connector is read out by the motherboard.

DESCRIPTION OF THE PREFERRED EMBODIMENTS

Figure 1:
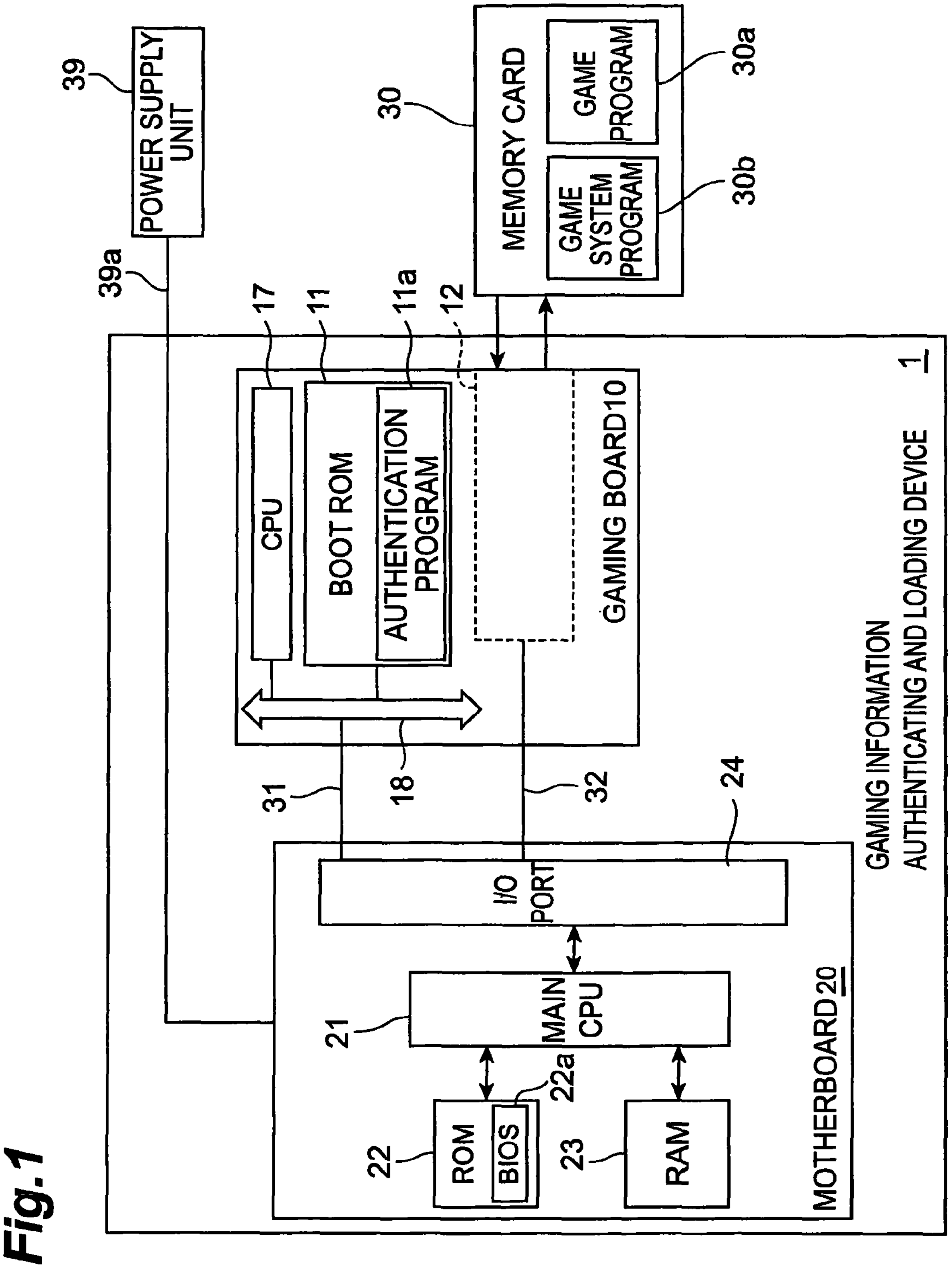
FIG. 1 is a block diagram showing the general constitution of a gaming information authenticating and loading device according to an embodiment of the present invention.

Below, an embodiment of the present invention will be described. The same reference numeral is used for the same constituent elements, and duplicated description thereof is omitted.

(General constitution of gaming information authenticating and loading device)

FIG. 1 is a block diagram showing the general constitution of a gaming information authenticating and loading device 1. The gaming information authenticating and loading device 1 has a gaming board 10 constituting an loading device according to the present invention, and a motherboard 20 constituting a processing device according to the present invention.

The gaming information authenticating and loading device 1 is constituted by connecting the gaming board 10 with the motherboard 20 by means of a PCI bus 31 and an IDE bus 32 constituting a signal transmission unit. This gaming information authenticating and loading device 1 carries out an authenticating and loading process for authenticating and loading a game program 30*a* and game system program 30*b*, which form the gaming information of the present invention and are stored on the memory card 30.

The gaming board 10 comprises a CPU 17 and boot ROM 11 which are mutually connected by means of an internal bus 18, and a card slot 12 corresponding to the memory 30. The gaming board 10 is a device which loads a game program 30*a* and a game system program 30*b*, described hereinafter, in the motherboard 20 from a memory card 30 constituting a storage medium according to the present invention.

The CPU 17 and the boot ROM 11 which are mutually connected by the internal bus 18 are connected to the motherboard 20 by means of a PCI bus 31. The PCI bus 31 transmits signals between the motherboard 20 and the gaming board 10, and the PCI bus 31 also supplies power from the motherboard 20 to the gaming board 10. The boot ROM 11 stores an authentication program 11 a (described hereinafter), and a program (boot code) (not illustrated), and the like, whereby the CPU 17 can boot (start up) the authentication program 11*a*, and this boot ROM 11 has the function of the program memory of the present invention.

The authentication program 11*a* states a procedure (authentication procedure) for authenticating the gaming information, in other words, checking and verifying that the gaming information, which is the object of the authenticating and loading process, has not been manipulated. This authentication program 11*a* forms a program for authenticating the game program 30*a* and the game system program 30*b* supplied to a slot machine 41 via the memory card 30. This authentication program 11*a* may also be called a "manipulation checking program", since the authentication program 11*a* checks whether the game program 30*a* and the game system program 30*b* have not been manipulated.

The card slot 12 is connected to the motherboard 20 by means of an IDE bus 32. This card slot 12 is a slot (physical connection section) which allows the memory card 30 to be connected in such a manner that that the game program 30*a* and the game system program 30*b* stored thereon can be read out. The card slot 12 constitute the connector of the present invention, into which the memory card 30 can be inserted.

The motherboard 20 is constituted by means of a commercially available, generic motherboard (a printed circuit board mounted with the basic components of a personal computer). The motherboard 20 has, at least, a CPU (Central Processing Unit) 21, a ROM (Read Only Memory) 22, a RAM (Random Access Memory) 23, and an I/O port 24, as shown in FIG. 1. The PCI bus 31 and IDE bus 32 described above are connected to this I/O port 24.

The ROM 22 stores programs, such as the BIOS (Basic Input/Output System) 22*a* (standard BIOS on the motherboard 20) which is executed by the main CPU 21, and permanent data. When this BIOS 22*a* is executed by the main CPU 21, then prescribed initialization processing of the peripheral device is carried out, and a process for reading the game program 30*a* and the game system program 30*b* stored in the memory card 30 via the gaming board 10 is started. A memory device, such as a flash memory, is used for this ROM 22, and it is possible to use a memory whose contents are either rewritable or non-rewritable.

The data and the program used when the main CPU 21 is operating are stored in the RAM 23. The RAM 23 stores, at least, the game program 30*a* and the game system program 30*b*. Thus, the RAM 23 constitutes the readable and writable memory of the present invention.

The memory card 30 is the storage medium according to the present invention which stores gaming information used in playing a game, and in the present embodiment, a CF card is used. The game program 30*a* and the game system program 30*b* forming the gaming information according to the present invention are stored in this memory card 30 (see FIG. 4). The game program 30*a* and the game system program 30*b* respectively form slot game programs in the present embodiment.

A power supply unit 39 is connected via a power supply cable 39*a* to the motherboard 20 of the gaming information authenticating and loading device 1. When this power supply unit 39 supplies power to the motherboard 20, then the main CPU 21 of the motherboard 20 is started up, and substantially simultaneously with this, power is supplied to the gaming board 10 via the PCI bus 31, and the CPU 17 is started up.

(General constitution of slot machine)

Figure 2:
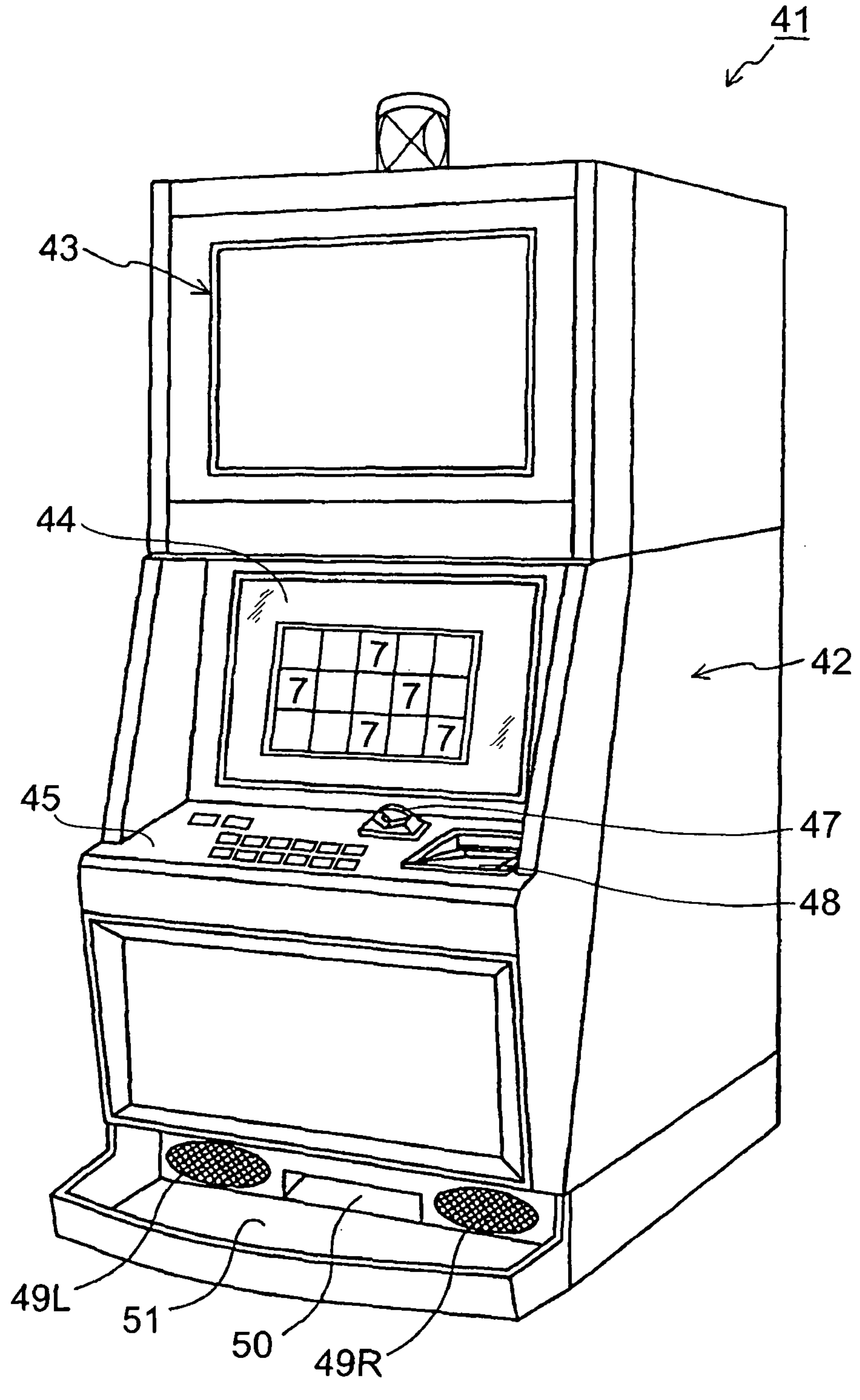
FIG. 2 is a perspective diagram showing the general constitution of a slot machine, which is a gaming machine relating to an embodiment of the invention.

FIG. 2 is an oblique diagram showing the general constitution of the slot machine 41. The slot machine 41 is a gaming machine relating to the present embodiment of the invention. This slot machine 41 incorporates the gaming information authenticating and loading device 1 having the aforementioned constitution, and executes a gaming operation for playing a game, on the basis of a game program 30*a* and a game system program 30*b* incorporated into this authenticating and loading device 1.

This slot machine 41 has a display which displays gaming images used for gaming. The display shows a state where a plurality of (five) reels having a plurality of pictures are aligned, and the display shows a variable display image (reel image) exactly as if the respective reels are scrolling. This slot machine 41 is a video slot machine that executes a slot game in which pay-out is decided in accordance with the combination of pictures at the time that the respective reels shown by the display come to a halt (the reels shown by the image may also be called "simulated reels").

The slot machine 41 has a frame 42, and an upper side image display panel 43 and a lower side image display panel 44 are provided on the front side of this frame 42. The upper side image display panel 43 is constituted by a liquid crystal display device, and displays an image which does not relate directly to the game (a description of the game, for example), in such a manner that the image displayed thereon changes in accordance with the operational contents. The lower side image display panel 44 is located in a substantially central position in the vertical direction of the frame 42, and is constituted by a liquid crystal display device (not illustrated), in such a manner that a game image comprising reel images is displayed.

The slot machine 41 also comprises a control panel 45 comprising an arrangement of a plurality of operating buttons whereby the player can perform prescribed operations, on the lower part of the lower side image display panel 44, and a coin inlet 47 for introducing gaming media (hereinafter, called "coins") used in playing a game, such as medals, money coins, or the like, and a banknote inlet 48 having a banknote input sensor 48*a* (see FIG. 3) which outputs a signal indicating input of a banknote, provided in order that a player can introduce banknotes, are disposed on the right-hand side of the control panel 45. Furthermore, the slot machine 41 has at the base of the frame 42 a coin pay-out opening 50, and a coin receiving section 51 which collects coins that have been paid out, and furthermore, speakers 49L and 49R are provided respectively on the left and right-hand sides of the pay-out opening 50.

Figure 3:
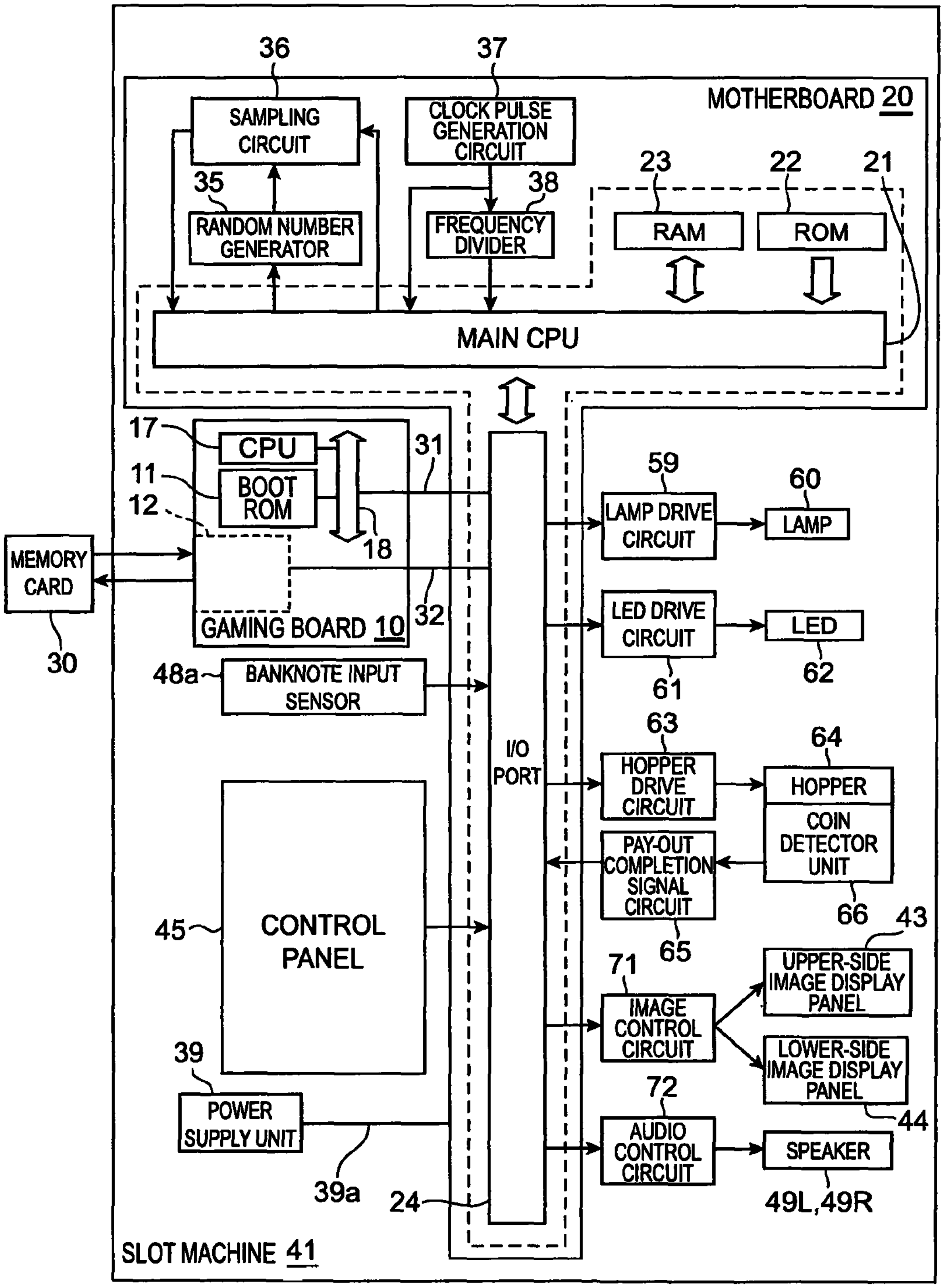
FIG. 3 is a block diagram of the slot machine shown in FIG. 2, describing the internal constitution of same.

FIG. 3 is a block diagram of a slot machine 41 focusing on the internal constitution of same. The slot machine 41 incorporates the motherboard 20 and the gaming board 10 constituting the gaming information authenticating and loading device 1 described above. The slot machine 41 also has a plurality of constituent elements constituting the gaming operation execution device of the present invention which executes gaming operations. The motherboard 20 comprises, in addition to the main CPU 21, ROM 22, RAM 23 and I/O port 24 described above, a random number generator 35, a sampling circuit 36, a clock pulse generator circuit 37, and a frequency divider 38. The random number generator 35 operates in accordance with instructions from the main CPU 21, and generates a random number within a prescribed range. The sampling circuit 36 samples a random number from the group of random numbers generated by the random number generator 35, in accordance with an instruction from the main CPU 21, and the random number generator 35 inputs the sampled random number to the main CPU 21. The clock pulse generator circuit 37 generates a reference clock for operating the main CPU 21, and the frequency divider 38 inputs a signal obtained by dividing the reference clock at a prescribed frequency, to the main CPU 21.

Moreover, the slot machine 41 comprises, as the aforementioned gaming operation execution devices, a lamp drive circuit 59, a lamp 60, an LED drive circuit 61, an LED 62, a hopper drive circuit 63, a hopper 64, a pay-out completion signal circuit 65, a coin detector unit 66, an image control circuit 71 and an audio control circuit 72. The elements from the lamp drive circuit 59 until the audio control circuit 72 constitute a group of gaming operation execution devices.

The lamp drive circuit 59 outputs a signal to the lamp 60 for causing the lamp 60 to light up and switching the lamp 60 on and off during the game. By means of this switching on and off, a game performance is created. The LED drive circuit 61 controls the on and off display of the LED 62. The LED 62 creates a number of credits display, a winning display, and the like. The hopper drive circuit 63 drives the hopper 64 in accordance with control implemented by the main CPU 21. The hopper 64 performs an operation for paying out coins that have been won as a prize, and pays out coins from the pay-out opening 50 into the coin receiving section 51. The coin detector unit 66 counts up the number of coins that have been paid out by the hopper 64, and data on the number thus counted is sent to the pay-out completion signal circuit 65. The pay-out completion signal circuit 65 inputs the number-of-coins data from the coin detector unit 66, and when this number of coins reaches a specified number of coins data, then the circuit 65 inputs a signal reporting the completion of coin pay-out to the main CPU 21.

The image control circuit 71 controls the respective image displays on the upper side image display panel 43 and the lower side image display panel 44. The image control circuit 71 displays various images, such as variable display images of a plurality of pictures, or the like.

The audio control circuit 72 inputs a sound signal from a sound source IC, amplifies the input sound signal and outputs sound from the speakers 49L and 49R. Thereby, sounds for raising the atmosphere of the game at suitable moments after the start of the game, for example, are output from the speakers 49L and 49R.

The image control circuit 71 and the audio control circuit 72 store an image control program and an audio control program in the ROM 22, and they can be incorporated into the motherboard 20 by executing the processing according to the respective programs, by means of the CPU 21.

Furthermore, the power supply unit 39 is connected to the other constituent elements, as well as the motherboard 20, but in FIG. 3, in order to simplify the diagram, the connections between the power source unit 39 and the constituent elements other than the motherboard 20 are omitted.

(Operation of gaming information authenticating and loading device and slot machine)

Next, the details of the operation of the gaming information authenticating and loading device 1, and the slot machine 41, having the constitution described above, are explained with reference to FIG. 1, and FIG. 4 and FIG. 5.

Figure 4:
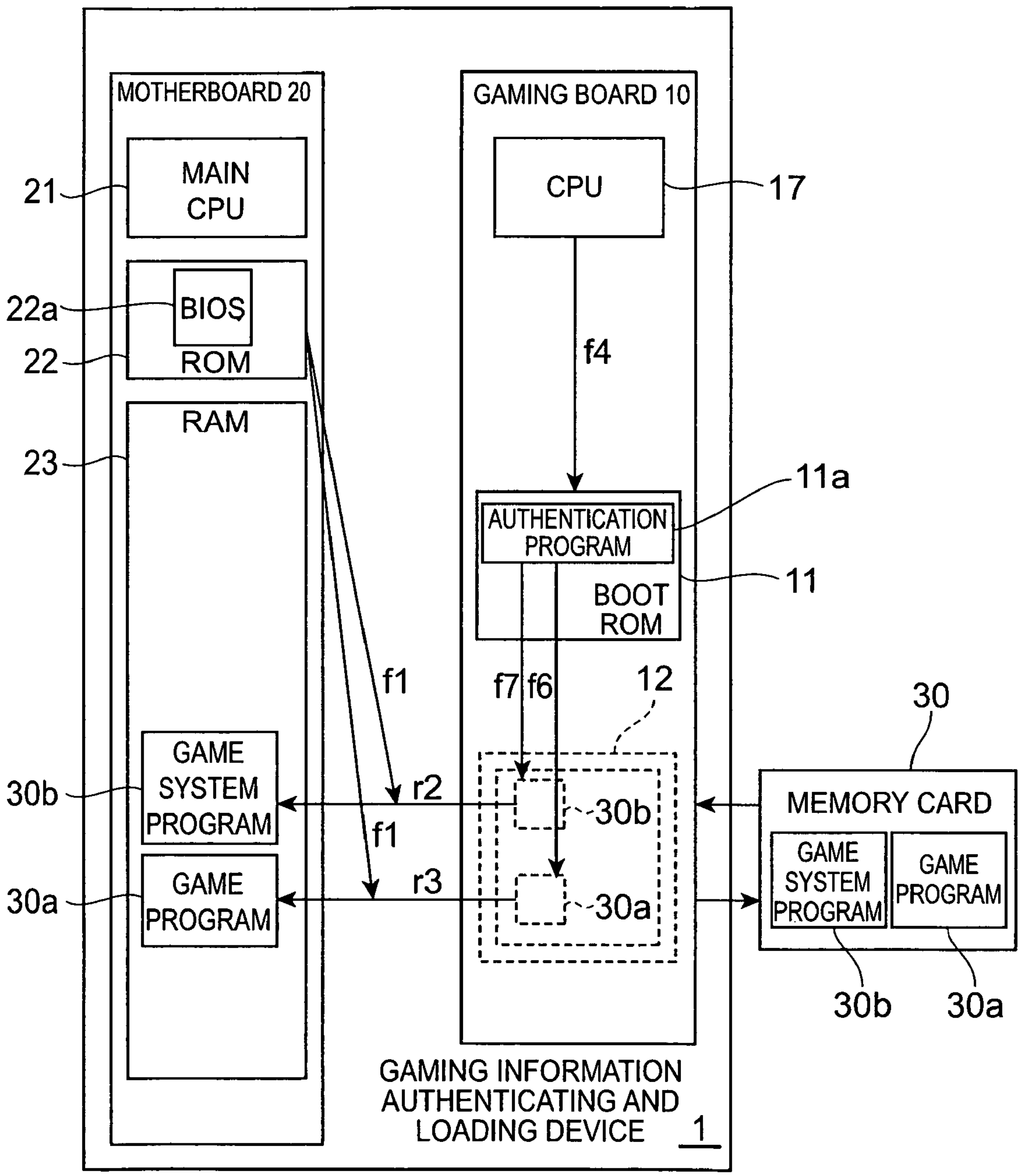
FIG. 4 is a block diagram showing the procedure of an authenticating and loading process for gaming information relating to the gaming information authenticating and loading device shown in FIG. 1.
Figure 5:
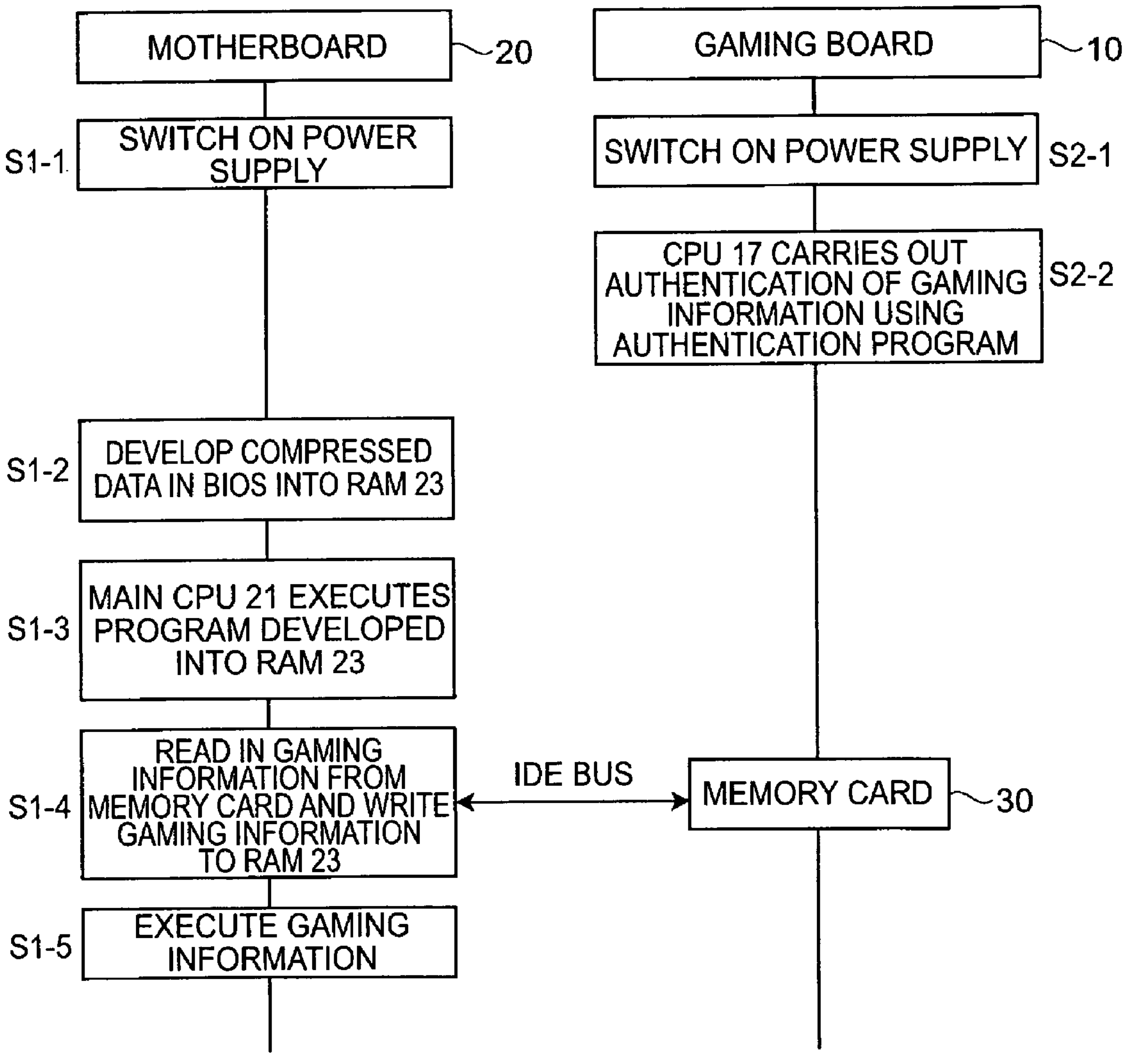
FIG. 5 is a chart showing the procedure of an authenticating and loading process for gaming information performed by the gaming board and motherboard shown in FIG. 1.

Here, FIG. 4 is a block diagram showing the procedure of a gaming information authenticating and loading process in the gaming information authenticating and loading device 1. FIG. 5 is a chart showing the procedure of an authenticating and loading process for gaming information performed by the gaming board 10 and the motherboard 20. In FIG. 5, "step" is abbreviated to "S".

In the gaming information authenticating and loading device 1 and the slot machine 41, during the authenticating and loading processing for gaming information, firstly, the power supply switch in the power source unit 39 is switched on (the power source is switched on), as shown in FIG. 5, and the motherboard 20 and the gaming board 10 are started up (Step 1-1, Step 2-1). In a substantially simultaneous fashion with the switching on of the power supply switch, the memory card 30 is inserted into the card slot 12 in the gaming board 10.

When the motherboard 20 and the gaming board 10 are started up, their independent processes are carried out respectively, in parallel fashion. More specifically, in the gaming board 10, the CPU 17 reads out the authentication program 11*a* stored in the boot ROM 11, and in accordance with the authentication program 11*a* thus read out, the CPU 17 operates as the processor of the present invention, and performs authentication processes f6, f7 (See FIG. 4.) with respect to the gaming information stored on the memory card 30 (in other words, the CPU 17 authenticates the game program 30*a* and the game system program 30*b* with the authentication program 11*a*), before the gaming information is loaded into the motherboard 20 (Step 2-2).

Although not shown in the drawings, if an abnormality occurs during the authentication process for a reason of some kind, for instance, if the game system program 30*b* has been manipulated, and the CPU 17 has not normally completed the authentication process, then the CPU 17 halts the authentication process, and sends an error signal to the main CPU 21, via the PCI bus 31. The main CPU 21 then reports the occurrence of an abnormality, for instance, by issuing an error display on the upper-side image display panel 43. In this case, the loading processes r2, r3 described below are not carried out. In other words, the game program 30*a* and the game system program 30*b* are introduced into the motherboard 20 only when they have been authenticated.

On the other hand, in the motherboard 20, the main CPU 21 executes the BIOS 22*a* and develops the compressed data included in the BIOS 22*a* into the RAM 23 (Step 1-2). When the main CPU 21 advances to Step 1-3, the main CPU 21 executes the BIOS 22*a* developed into the RAM 23 and then carries out diagnosis and initialization of the various peripheral devices. In this case, the main CPU 21 carries out a check to see what devices are connected to the IDE bus 32, and then accesses the memory card 30 inserted into the card slot 12, via the IDE bus 32.

As the next step, 1-4, the main CPU 21 operates as the reading unit of the present invention, and reads out the gaming information 30*a* and 30*b* from the memory card 30. Further, the main CPU 21 operates as the writing unit of the present invention, and performs an loading process r2 for the game system program 30*b* authenticated by CPU 17, and an loading process r3 for the game program 30*a* authenticated by CPU 17, and writing and storing the game program 30*a* and the game system program 30*b* in the RAM 23. In the loading process r2 and the loading process r3, in accordance with the functions of the standard BIOS in the BIOS 22*a*, the main CPU 21 takes the check sum acquired by an ADDSUM method (standard check function), and the main CPU 21 stores the game program 30*a* and the game system program 30*b* in the RAM 23, while carrying out a confirmation process f1 (see FIG. 4) to see whether or not storage has been completed without any errors.

In this way, the authenticating and loading processing is completed by the processing in steps 2-1 to 2-2 performed by the CPU 17, and steps 1-1 to 1-4 performed by the main CPU 21, and the gaming information authenticating and loading device 1 accomplishes the process.

Continuously, in the slot machine 41, the main CPU 21 advances to Step 1-5, where the main CPU 21 operates as the operation control unit, and implements control in such a manner that the respective gaming operation execution devices carry out gaming operations, in accordance with the game program 30*a* and the game system program 30*b* stored in the RAM 23. Thereby, the plurality of constituent elements for gaming operation execution devices which constitute a group of gaming operation execution devices perform respective gaming operations. For example, the image control circuit 71 displays gaming information used in playing a game, such as simulated reels, on the lower-side image display panel 44, and furthermore, the lamp drive circuit 59 lights up the lamp 60, or the like, principally in order to create a game effect, in accordance with the progress of the game. Moreover, the hopper drive circuit 63 operates the hopper 64 in accordance with the game winnings result, and thus pays out coins. The player is able to play a slot game by observing the simulated reels.

In this way, in a slot machine 41, the gaming operation execution devices carry out gaming operations in accordance with the game program 30*a* and the game system program 30*b* supplied by means of the memory card 30 and stored in the RAM 23 after the programs 30*a* and 30*b* are authenticated. Thereby, the player is able to play a slot game.

As described above, in the gaming information authenticating and loading device 1 and the slot machine 41, since the gaming board 10 is connected to a generic motherboard 20, then by inserting the memory card 30 storing gaming information into the card slot 12 of the gaming board 10, the stored gaming information can be read out and stored in the RAM 23 of the motherboard 20.

Moreover, since the authentication program 11*a* which states a procedure for authenticating the gaming information is stored in the boot ROM 11 of the gaming board 10, then before loading the gaming information 30*a* and 30*b* into the motherboard 20, an authentication process is performed in accordance with the authentication program 11*a*, and it is checked and verified that the gaming information has not been manipulated. Consequently, in the authenticating and loading device 1 and the slot machine 41, even if gaming information 30*a* and 30*b* is supplied from a source that is external to the slot machine 41, it is certain that the gaming information 30*a* and 30*b* thus loaded is legitimate gaming information which has not been manipulated. Therefore, illegal actions relating to the actual gaming information are reliably prevented. Furthermore, the authentication program 11*a* used to authenticate the gaming information 30*a* and 30*b* is stored in the boot ROM 11, in a non-rewritable fashion.

Moreover, in the gaming information authenticating and loading device 1 and the slot machine 41, since the motherboard 20 is constituted by a commercially available generic motherboard, the motherboard 20 has highly generic characteristics and, consequently, it is possible to reduce manufacturing costs.

In the foregoing description, a game program 30*a* and a game system program 30*b* for a slot game are loaded, but instead of this, it is also possible to load a separate game program 30*a* and a game system program 30*b* for another game. In this case, the slot machine 41 becomes a game machine (for instance, a card game machine) which implements another game (for example, a card game which displays card images of trump cards).

Figure 6:
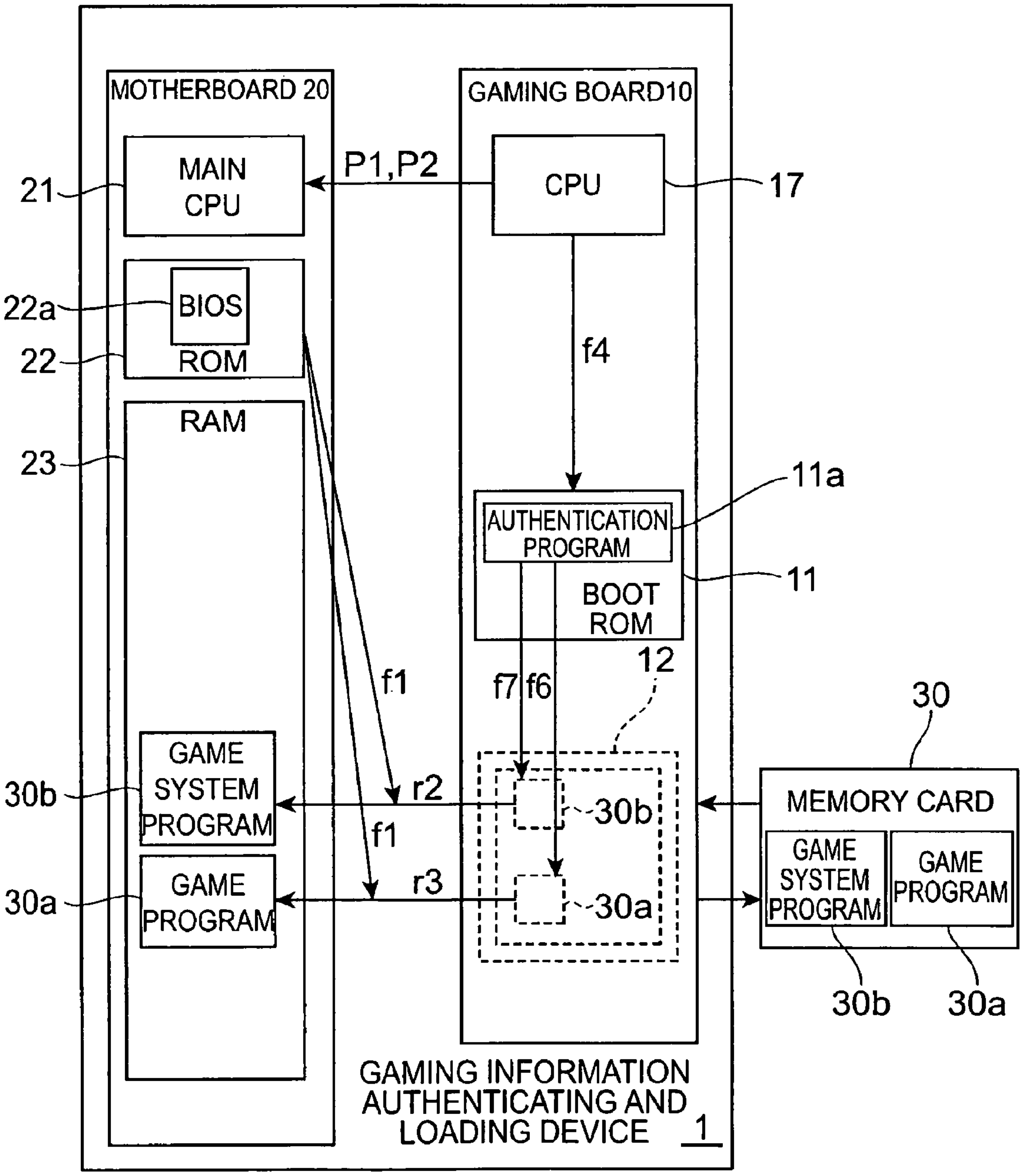
FIG. 6 is a block diagram showing the procedure of an authenticating and loading process for gaming information according to an embodiment different from the procedure shown in FIG. 4.
Figure 7:
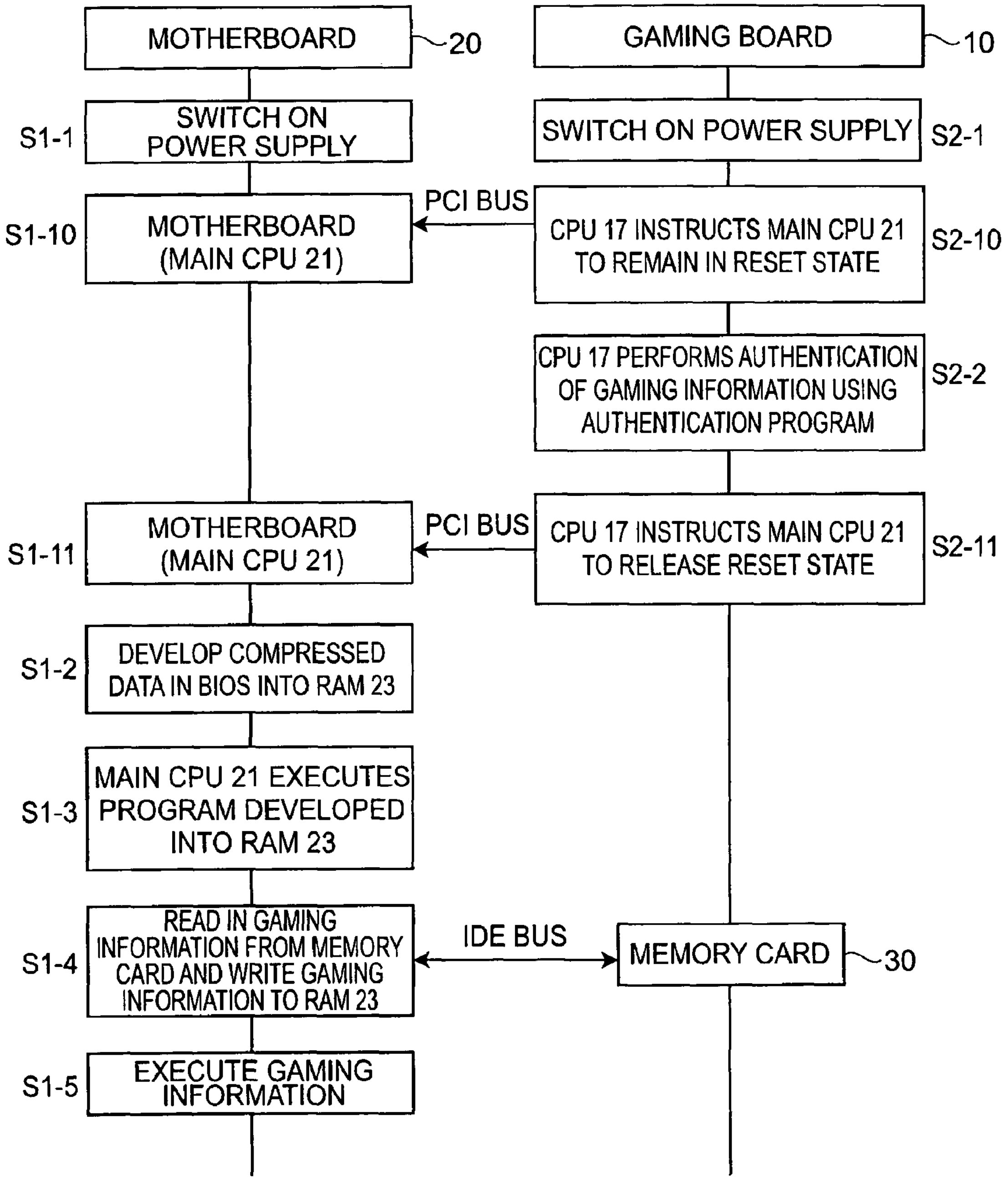
FIG. 7 is a chart showing the procedure of an authenticating and loading process for gaming information performed by the gaming board and motherboard, which is different from the procedure shown in FIG. 5.

Instead of the procedure of the gaming information authenticating and loading process performed by the gaming board 10 and the motherboard 20 described above, it is also possible to adopt a procedure such as that shown in FIG. 6 and FIG. 7. Specifically, the procedure of the gaming information authenticating and loading process shown in FIG. 6 and FIG. 7 is different from the aforementioned procedure in that reset control of the main CPU 21 is carried out, when the CPU 17 performs authentication of the gaming information 30*a* and 30*b*.

More specifically, similarly to the procedure of the authenticating and loading process for gaming information described above, the power supply switch on the power source unit 39 is switched on (the power supply is switched on), and the motherboard 20 and the gaming board 10 are started up (Step 1-1, Step 2-1). Thereby, in the gaming board 10, the CPU 17 advances to Step 2-10, and a reset signal output process P1 (see FIG. 6) is performed by the main CPU 21, via the PCI bus 31. By carrying out the reset control output process PI, the main CPU 21 is held in a reset state and the readout process of the gaming information 30*a* and 30*b* is not executed, until there is an output process P2 of the reset release signal (authentication completion signal) at the subsequent step, Step 2-11. Thereupon, the CPU 17 advances to Step 2-2, performs readout of the authentication program 11*a* stored in the boot ROM 11, and carries out the authentication processes f6, f7 in accordance with the authentication program 11*a* thus read out. When the authentication processes f6, f7 have been completed normally, the procedure advances to Step 2-11, and the CPU 17 performs a reset release signal output process P2 (see FIG. 6), thereby releasing the reset state of the main CPU 21.

As described above, by adopting reset control using a reset signal and a reset release signal, the readout of the gaming information 30*a* and 30*b* by the main CPU 21 in the motherboard 20 is suspended, until the authentication processes f6, f7 by the CPU 17 on the gaming board 10 have been completed, and therefore, it is possible reliably to avoid a situation where the main CPU 21 reads out the gaming information 30*a* and 30*b* before the authentication processes f6, f7 have been completed by the CPU 17. Furthermore, by adopting reset control of this kind, it is possible to avoid a situation in which tie CPU 17 and the main CPU 21 access the PCI bus 31 at the same timing, thus causing a conflict of signals, without using separate means, such as a bus switching device.

However, in general, the execution time of the BIOS 22*a* by the main CPU 21 (the sequence of processing from Step 1-2 to Step 1-3) is significantly longer than the processing time of the authentication processes f6, f7 (Step 2-2) by the CPU 17. Therefore, it is desirable that the CPU 17 and the main CPU 21 should be carried out in parallel without adopting reset control, as shown in FIG. 5, from the viewpoint of being able to shorten the time period until the gaming information is executed at Step 1-7.

In an embodiment where the CPU 17 and the main CPU 21 carry out processing in parallel, it is also possible to avoid situations where the main CPU 21 reads out the gaming information 30*a* and 30*b* before the authentication processes f6, f7 by the CPU 17 have been completed, by a method other than reset control. Specifically, a prescribed storage region (for example, a register or memory) for confirming the completion of the authentication processes f6, f7 is provided previously in either the gaming board 10 or the motherboard 20. When the authentication processes f6, f7 have been completed, the CPU 17 rewrites the contents of the prescribed storage region, and by means of the main CPU 21 monitoring this rewriting process, the main CPU 21 is able to determine the completion of the authentication processes f6, f7 by the CPU 17. After determining that the authentication processes f6, f7 have completed, the main CPU 21 performs readout of the gaming information 30*a* and 30*b*, thereby preventing situations in which the main CPU 21 reads out the gaming information 30*a* and 30*b* before the authentication processes f6, f7 by the CPU 17 have completed. At the same time, it is also possible to avoid situations in which the CPU 17 and the main CPU 21 access the PCI bus 31 simultaneously, thus producing signal conflicts, without having to use separate means, such as a bus switching device.

In the aforementioned embodiments, a slot machine 41 which performs a slot game is described as an example of a gaming machine, but the present invention may also be applied to gaming machines which implement other types of games. For example, the present invention may also be applied to a card game machine which implements a card game using card images showing trump cards, a Mahjong game machine which implements a Mahjong game, or a Pachinko game machine which uses game balls. Furthermore, in the case of a slot machine, the machine is not limited to being a video slot machine such as the slot machine 41, but may also be a rotating cylinder type of slot machine which has mechanical reels. In this case, the mechanical reels constitute the gaming operation execution device of the present invention. In the embodiments described above, the gaming information is constituted by two types of programs, namely, a game program and a game system program, but the gaming information may also be modified appropriately to gaming information constituted by one type of program, or three or more types of program.

What is claimed is:

1. A gaming machine comprising:

a gaming board having a memory card mounted on the gaming board, the gaming board including:

a first CPU; and a first memory for storing an authentication program for authenticating game information stored in the memory card; and a motherboard connected to the gaming board via a signal transmission unit including a PCI Bus and an IDE Bus, the motherboard including;

a second CPU; and a second memory for storing the game information stored in the memory card, wherein after startup of each of the gaming board and the motherboard, the first CPU of the gaming board transmits a reset signal to the second CPU via the PCI Bus such that the second CPU remains in a reset state and readout of the game information by the second CPU is suspended until receipt of a reset release signal, after transmission of the reset signal to the second CPU, the first CPU reads the authentication program stored in the first memory and performs an authentication process with respect to the game information stored in the memory card before the game information is loaded onto the motherboard, where no abnormalities are detected during the authentication process, the first CPU transmits the reset release signal as an authentication complete signal to the second CPU of the motherboard via the PCI Bus, upon receipt of the reset release signal, the second CPU reads the gaming information from the memory card via the IDE Bus, loads the game information onto the second memory, and carries out gaming operation in accordance with the game information stored in the second memory, wherein the first and second CPUs have simultaneous access to the PCI Bus without the use of a BUS switching device.

2. The gaming machine according to claim 1, wherein:

a BIOS for diagnosing and initializing various peripherals is included in the second memory; and the second CPU performs diagnosis and initialization of the various peripherals by executing the BIOS of the second memory and executes the processes of reading out game information stored in the memory card and storing the read out game information in the second memory, in a case where it is verified that the game information stored in the memory card is authenticated, and executing the game, based on the game information stored in the second memory, after the execution of the BIOS.

3. The gaming machine according to claim 2, wherein:

the second CPU executes a process of verifying whether or not the game information stored in the memory card is reliably stored in the second memory by execution a check process of the second memory's BIOS; and, while execution the process of verifying, executes a process of reading out game information stored in the memory card and, in a case where it is verified that the game information stored in the memory card is authenticated, the second CPU stores the read out game information in the second memory.

* * * * *